United States Patent
Nishimura (10) Patent No.: US 7,514,795 B2
(45) Date of Patent: Apr. 7, 2009

(54) SEMICONDUCTOR INTEGRATED CIRCUIT HAVING IMPROVED POWER SUPPLY WIRING

(75) Inventor: Hidetoshi Nishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 530 days.

(21) Appl. No.: 11/229,503

(22) Filed: Sep. 20, 2005

(65) Prior Publication Data
US 2006/0071319 A1   Apr. 6, 2006

(30) Foreign Application Priority Data
Sep. 30, 2004   (JP) ............... 2004-286576

(51) Int. Cl.
    *H01L 23/52* (2006.01)
(52) U.S. Cl. ............... 257/776; 257/E23.142
(58) Field of Classification Search ............... 257/734, 257/741, 750, 758, 759, 760, 773, 774, 775, 257/776, E23.141, E23.142, E23.145
See application file for complete search history.

(56) References Cited

U.S. PATENT DOCUMENTS 6,031,293 A * 2/2000 Hsuan et al. ............... 257/786
6,166,442 A * 12/2000 Nakamura ............... 257/773

FOREIGN PATENT DOCUMENTS

| JP | 08-046049 | 2/1996 |
| JP | 10-056162 | 2/1998 |
| JP | 11-045979 | 2/1999 |

\* cited by examiner

*Primary Examiner*—Evan Pert
*Assistant Examiner*—Kevin Quinto
(74) *Attorney, Agent, or Firm*—McDermott Will & Emery LLP (57) ABSTRACT

In a semiconductor integrated circuit including a plurality of cells, a supplementary power-supply wire is disposed between a lattice-shaped upper power-supply wire and a lower cell power-supply wire for cases in which power is supplied from the upper power-supply wire to the lower cell power-supply wire. The supplementary power-supply wire and the lower cell power-supply wire are connected by two vias. The supplementary power-supply wire and the upper power-supply wire are connected by a single via. Current from the supplementary power-supply wire is divided by the two vias and then supplied to the lower cell power-supply wire. Therefore, when power is supplied from the upper power-supply wire to the lower cell power-supply wire, current concentration at the connection points of the lower cell power-supply wire to the vias is decreased, thereby reducing wire breaks caused by EM (electro migration).

6 Claims, 10 Drawing Sheets

SEMICONDUCTOR INTEGRATED CIRCUIT HAVING IMPROVED POWER SUPPLY WIRING

CROSS-REFERENCE TO RELATED APPLICATIONS

This Non-provisional application claims priority under 35 U.S.C. §119(a) on Patent Application No. 2004-286576 filed in Japan on Sep. 30, 2004, the entire contents of which are incorporated herein by reference.

BACKGROUND OF THE INVENTION

The present invention relates to semiconductor integrated circuits, and more particularly relates to a power-supply wiring structure for optimizing the amount of IR drop and the flow of current in the power-supply wiring.

As semiconductor devices for semiconductor integrated circuits have been miniscaled, the number of semiconductor devices integrated on a chip has been increasing year after year, forcing the power-supply wiring in the chip to be increased in length and decreased in wire width. In addition, the problem of how to ensure signal integrity has manifested itself. In particular, how to deal with IR drop and electro migration (which will be hereinafter referred to as "EM") that occur in power-supply wiring has become a critical issue.

Conventional techniques for addressing these problems of IR drop and EM that occur in power-supply wiring will be described below.

If a miniscaled semiconductor device has a scaling coefficient of k, the wire length, wire width, wire-to-wire distance, and wire thickness of the power-supply wiring is reduced by the scaling coefficient k in order to keep effects on the semiconductor device at the same level as those in the conventional fabrication process. As a result, a wire resistance per unit length of the power-supply wiring increases to the square of the scaling coefficient k, and the IR drop resulting from the increased resistance of the power-supply wiring decreases the operational reliability of the semiconductor device. A conventional technique for overcoming this IR-drop-related problem is described, for example, in Japanese Laid-Open Publication No. 11-45979 (Document 1).

Figure 12:
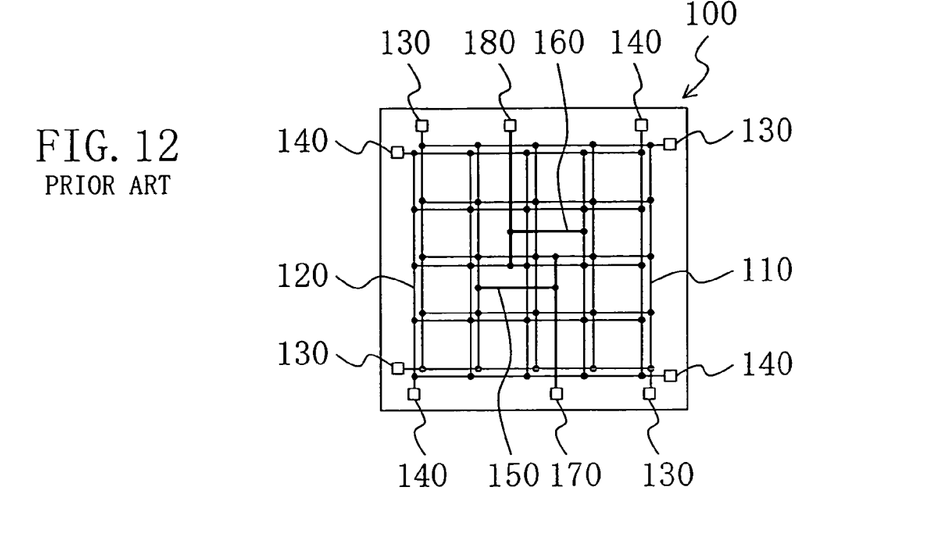
FIG. 12 is a plan view of a conventional power-supply wiring structure.

FIG. 12 illustrates the conventional technique disclosed in Document 1, which provides a method for power-supply wiring arrangement. In FIG. 12, power-supply wiring 110 and ground wiring 120 for supplying power supply voltages to internal circuits are disposed in a semiconductor chip 100. The power-supply wiring 110 and the ground wiring 120 extend vertically and horizontally to form lattices. The lattice-shaped power-supply wiring 110 is connected with power supply pads 130 for supplying the power supply voltage provided from an external device. Likewise, the lattice-shaped ground wiring 120 is connected with ground pads 140.

In FIG. 12, supporting power-supply wiring 150 and supporting ground wiring 160 are disposed to support the lattice-shaped power-supply wiring 110 and the lattice-shaped ground wiring 120, respectively. The supporting power-supply wiring 150 is connected to a power supply pad 170, which is provided independently of the power supply pads 130, while the supporting power-supply wiring 150 is divided into branches, which are connected to the lattice-shaped power-supply wiring 110. Similarly, the supporting ground wiring 160 is connected to a ground pad 180, which is provided independently of the ground pads 140, while the supporting ground wiring 160 is divided into branches, which are connected to the lattice-shaped ground wiring 120.

In the power-supply wiring structure shown in Document 1, the supporting power-supply wiring 150 connected to the ground pad 170 that operates independently of the power supply pads 130 is connected to the lattice-shaped power-supply wiring 110, while the supporting ground wiring 160 connected to the ground pad 180 that operates independently of the ground pads 140 is connected to the lattice-shaped ground wiring 120, whereby IR drop can be restricted within certain limits so that the circuit operation is not affected by the IR drop.

On the other hand, when the scaling of a semiconductor device is reduced by a factor k, and so are the wire length, wire width, wire-to-wire distance, and wire thickness of the power-supply wiring, the current density in the power-supply wiring is increased by the factor k. This increase in the current density in the power-supply wiring raises the rate of occurrence of EM-related wire breaks. EM is a phenomenon in which metal atoms in wiring are diffused by interaction between the metal atoms and the electrons traveling through the wiring to cause failures in the wiring. Specifically, EM causes the creation of voids at the cathode of the wiring, leading to an open failure, or causes the growth of hillocks or whiskers at the anode of the wiring, resulting in a short failure. As a measure to solve these EM-caused problems, there has been a conventional technique, which is disclosed in Japanese Laid-Open Publication No. 10-56162 (Document 2), for example.

Figure 13:
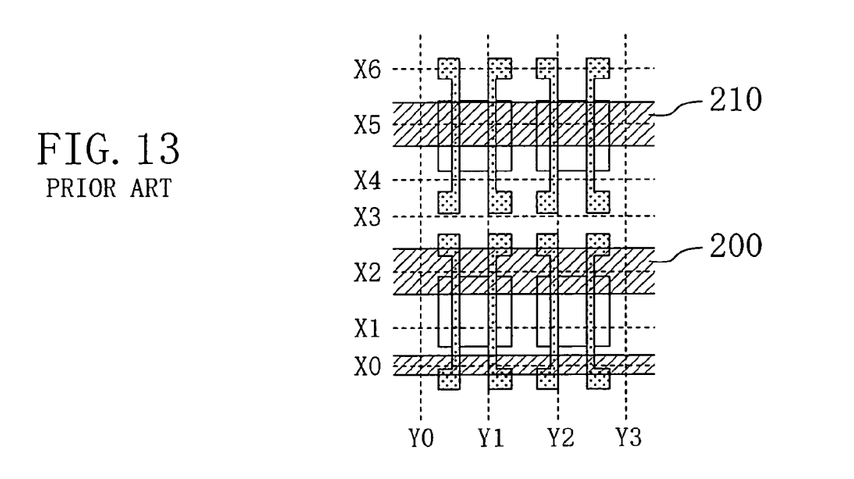
FIG. 13 is a plan view of another conventional power-supply wiring structure.

FIG. 13 illustrates a power-supply wiring structure disclosed in Document 2. In FIG. 13, a plurality of vertically extending wire tracks Y0 to Y3 are spaced uniformly, while a plurality of horizontally extending wire track X0 to X6 are spaced at two different intervals. More specifically, the set of horizontal lines is defined by the wire tracks X1 to X3 and X4 to X6 that have a first pitch and the wire tracks X0 to X1 and X3 to X4 that have a second pitch, which is narrower than the first pitch. In this structure, a power supply wire 200 formed along the wire track X2 of the wire channel lattice, and a power supply wire 210 formed along the wire track X5 can be formed to have a large wire width, for example. As in this technique, if the pitch distance between adjacent wire tracks in some areas is set larger than in the other area, some wires in the power-supply wiring can have a larger width. As a result, the cross sectional area of those power-supply wires with a larger width is increased, thereby effectively suppressing EM-caused reduction in wire yield.

Figure 14:
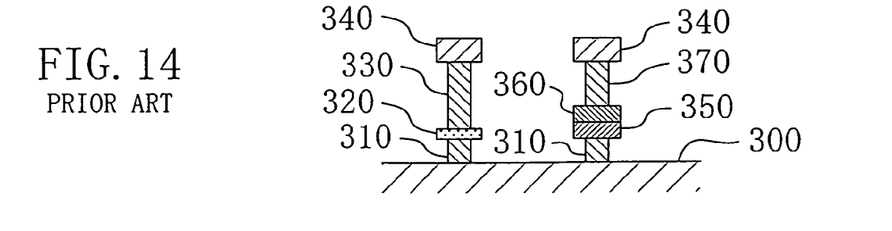
FIG. 14 is a cross-sectional view of still another conventional power-supply wiring structure.

Another conventional technique for overcoming the EM-caused problems is described in Japanese Laid-Open Publication No. 8-46049 (Document 3), for example. FIG. 14 illustrates a power-supply wiring structure disclosed in Document 3. In FIG. 14, a first-layer wire 320, which is a thin signal wire, is connected to a semiconductor substrate 300 by a contact 310, and also connected to a third-layer wire 340 by a via 330. On the other hand, a first-layer power supply wire 350 and a second-layer power supply wire 360 are in direct contact with each other with no via interposed therebetween. The first-layer wire 350 is connected to the semiconductor substrate 300 by a contact 310, while the second-layer wire 360 is connected to the third-layer wire 340 by a via 370. In this power-supply wiring structure, it can be considered that the cross sectional area of the power supply wire 350 is increased by the second-layer power supply wire 360, such that resistance to EM can be increased.

However, in cases in which the technique disclosed in Document 1 is employed as a measure to cope with the above-mentioned IR drop, the lattice-shaped power-supply wiring 110 is directly connected to cell power-supply wiring formed on lower cells located below the lattice-shaped power-supply wiring 110, by vias formed in an insulating layer provided between the lattice-shaped power-supply wiring 110 and the cell power-supply wiring, in order to supply power from the upper lattice-shaped power-supply wiring 110 to the lower cells. In this technique, since the supporting power-supply wiring 150 also supplies power so as to overcome the IR-drop problem, the current density is increased at the connection points of the cell power-supply wiring to the vias. Therefore, the wire width of the cell power-supply wiring must be increased so that the current density in the cell power-supply wiring does not exceed a maximum allowable current density level. It is thus difficult to reduce the wire width of the cell power-supply wiring for reduction in the cell area, which results in the increased cell area.

On the other hand, when the technique disclosed in Document 2 is used as a measure to address the problem of maximum allowable current density in the cell power-supply wiring, that is, as a measure to improve resistance to EM, there arises the disadvantage of causing the resultant semiconductor chip area to be increased. Specifically, when the technique in Document 2, which is designed to be applied to gate array cells, is applied to a standard cell system, the distance between the cell power-supply wiring and the cell ground wiring, and hence the area of each cell, are increased. This results in increases in the semiconductor chip area.

Moreover, when the technique disclosed in Document 3 is used as a measure to improve EM resistance, the following disadvantage arises. Since the first-layer power supply wire 350 and the second-layer power supply wire 360 are in direct contact with each other, the wiring thickness is increased. Consequently, the fringing capacitance between the side faces of the power supply wires 350 and 360 and the signal wire 320 located close to those side faces is increased and cannot be regarded as negligible anymore, and the resultant crosstalk with the neighboring signal wire 320 increases signal propagation delay or causes noises in the signal wire 320.

SUMMARY OF THE INVENTION

It is therefore an object of the present invention to provide a semiconductor integrated circuit, in which reliability in terms of prevention of EM-caused wire breaks is increased by suppressing current concentration caused when power is supplied from upper power-supply wires to lower cell power-supply wires, with crosstalk with neighboring signal wires being suppressed effectively, without increasing the cell area.

In order to achieve the object, in the present invention, supplementary power-supply wires are provided between upper power-supply wires and lower cell power-supply wires, and power supply from the supplementary power-supply wires to the lower cell power-supply wires is performed through a plurality of vias. This structure eliminates the need for increasing the wire width of the cell power-supply wires, thereby preventing the cell area from being increased while eliminating the necessity to increase the thickness of the cell power-supply wires, thereby preventing crosstalk with neighboring signal wires.

Specifically, an inventive semiconductor integrated circuit including a plurality of cells includes: a cell power-supply wire formed for the cells; and a supplementary power-supply wire disposed above the cell power-supply wire, wherein the cell power-supply wire and the supplementary power-supply wire are connected with each other by at least two vias; and power is supplied from the supplementary power-supply wire to the cell power-supply wire through the at least two vias.

In one embodiment of the present invention, an upper power-supply wire is disposed above the supplementary power-supply wire; the upper power-supply wire and the supplementary power-supply wire are connected with each other by a single via; and power is supplied from the upper power-supply wire to the supplementary power-supply wire through the single via.

In another embodiment of the present invention, the supplementary power-supply wire has a larger wire width than the cell power-supply wire.

In another embodiment of the present invention, the upper power-supply wire is a lattice-shaped power-supply wire arranged in a lattice.

In another embodiment of the present invention, the two vias that connect the cell power-supply wire and the supplementary power-supply wire are disposed in opposite directions with respect to the single via that connects the supplementary power-supply wire and the upper power-supply wire, the two vias being located at a given distance from the single via.

In another embodiment of the present invention, at least a predefined number of cells is located between the two vias that connect the cell power-supply wire and the supplementary power-supply wire.

In another embodiment of the present invention, at least a predefined number of intra-cell power-supply wires, which are disposed within the cells and connected to the cell power-supply wire, is located between the two vias that connect the cell power-supply wire and the supplementary power-supply wire.

In another embodiment of the present invention, between the two vias that connect the cell power-supply wire and the supplementary power-supply wire, density of current flowing through the cell power-supply wire is equal to or less than a predetermined value.

According to the present invention, the cell power-supply wire and the supplementary power-supply wire located above the cell power-supply wire are connected at least by the two vias. Therefore, when power is supplied from the supplementary power-supply wire to the lower cell power-supply wire, the current from the supplementary power-supply wire is divided by the at least two vias, thereby decreasing current concentration at the connection points of the cell power-supply wire to the at least two vias. As a result, EM-caused metal wire breaks are effectively prevented at these connection points.

In particular, in one embodiment of the present invention, power is supplied from the upper power-supply wire to the supplementary power-supply wire through the single via. This structure would conventionally cause the current density to be increased at the connection point of the supplementary power-supply wire to the via. However, in the present invention, the supplementary power-supply wire has a larger wire width and thus has a larger cross sectional area, which reduces the current density at the connection point of the supplementary power-supply wire to the via, thereby easily suppressing the current density below a maximum allowable value. In addition, since the supplementary power-supply wire is provided above the cell power-supply wire formed on the cells and thus does not affect the cell area, the cell area can be reduced, which allows the chip area to be reduced, even if the supplementary power-supply wire has an increased wire width.

Also, according to another embodiment of the present invention, the upper power-supply wire is a lattice-shaped power-supply wire. Therefore, when power is supplied from the upper power-supply wire to the supplementary power-supply wire, IR drop caused before the current reaches the cell power-supply wire is suppressed sufficiently, whereby malfunctions in the internal circuits in the cells are suppressed effectively.

Furthermore, according to another embodiment of the present invention, when power is supplied from the upper power-supply wire to the cell power-supply wire through the supplementary power-supply wire, the current from the upper power-supply wire is first supplied to the supplementary power-supply wire through the single via, and then divided into two portions going in the opposite directions. Each of the divided currents is supplied to the lower cell power-supply wire through a single via. That is, the current from the supplementary power-supply wire is divided into substantially equal amounts, which are then supplied to the lower cell power-supply wire. Therefore, current concentration caused at the connection point of the cell power-supply wire to each via is decreased effectively.

Moreover, according to another embodiment of the present invention, at least a predefined number of cells, or at least a predefined number of intra-cell power-supply wires connected to the cell power-supply wire is located between the two vias that connect the supplementary power-supply wire and the lower cell power-supply wire, or the density of current flowing through the cell power-supply wire is below a set value between the two vias. Therefore, the current density per unit cross-sectional area of the cell power-supply wire is reduced effectively, thereby enabling the wire width of the lower cell power-supply wire to be reduced.

DETAILED DESCRIPTION OF THE INVENTION

Hereinafter, preferred embodiments of the present invention will be described with reference to the accompanying drawings.

FIRST EMBODIMENT

Figure 1:
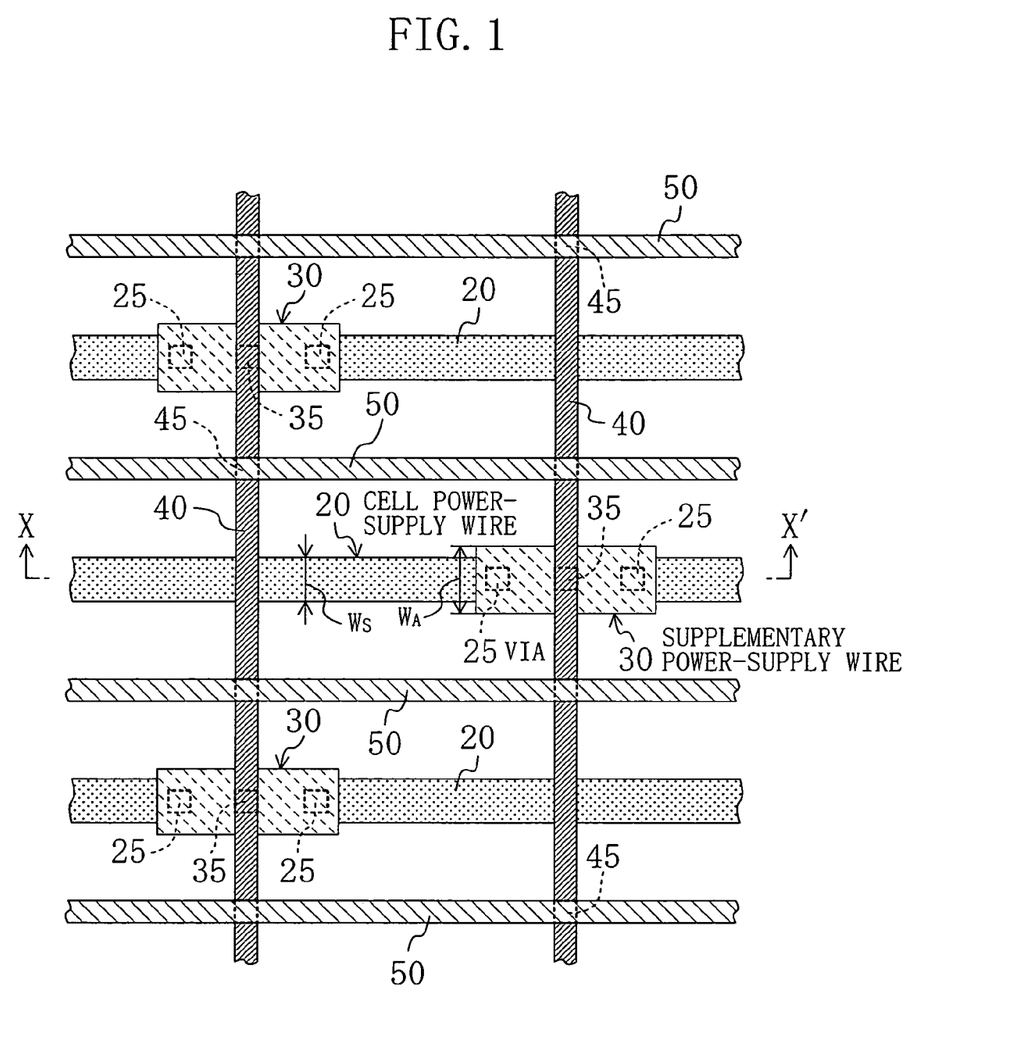
FIG. 1 is a plan view of a power-supply wiring structure in a semiconductor integrated circuit according to a first embodiment of the present invention.
Figure 2:
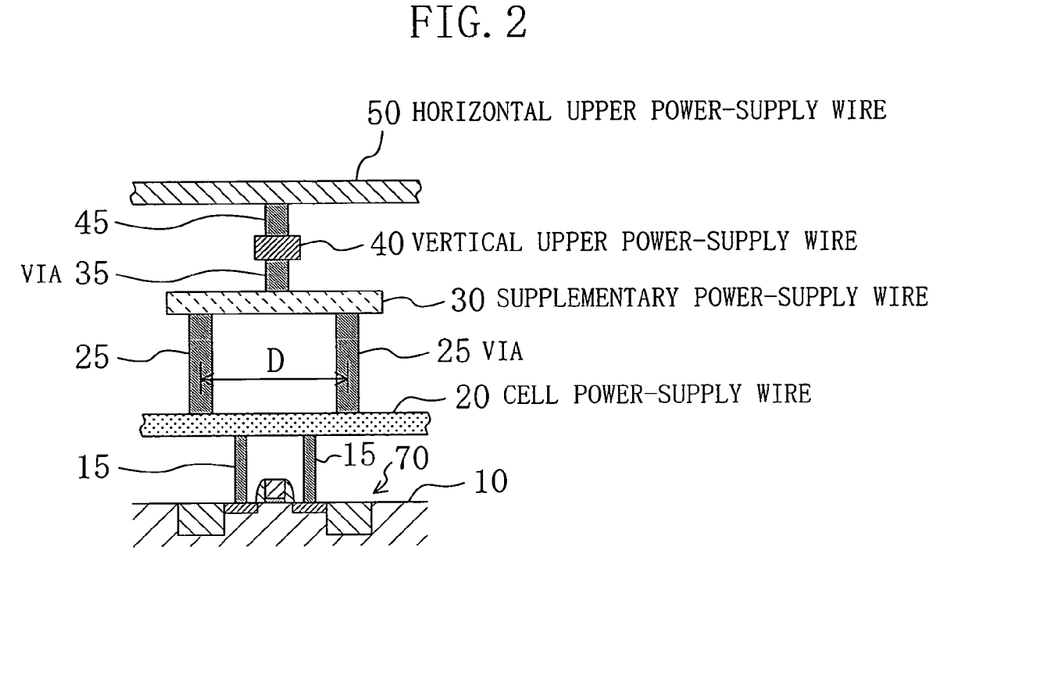
FIG. 2 is a cross-sectional view of the power supply wiring structure.

FIGS. 1 and 2 illustrate a power-supply wiring structure in a semiconductor integrated circuit according to a first embodiment of the present invention.

FIG. 1 is a plan view of the power-supply wiring structure in the semiconductor integrated circuit. In FIG. 1, a plurality of horizontal upper power-supply wires 50, which are disposed in the horizontal direction, and a plurality of vertical upper power-supply wires 40, which are vertically disposed below the power-supply wires 50, cross each other to form a lattice as a whole. At each of their intersection points, the horizontal power-supply wires 50 and the vertical power-supply wires 40 are connected to each other by a via 45. It should be noted that the number of vias 45 used for the connection at each intersection point is not limited to one, but two or more vias 45 may be used.

As shown in enlarged dimension in FIG. 7 (but not shown in FIG. 1), below the lattice of the upper power-supply wires 50 and 40, a plurality of standard cells 60 are horizontally arranged in two lines between two horizontal upper power-supply wires 50 and 50.

Moreover, as shown in FIG. 1, supplementary power-supply wires 30 that extend in the same direction as the horizontal upper power-supply wires 50 are provided below the vertical upper power-supply wires 40. Each supplementary power-supply wire 30 is connected to a vertical upper power-supply wire 40 by a via 35. The number of vias 35 used is not limited to one, but two or more vias 35 may by used.

Below the supplementary power-supply wires 30, cell power-supply wires 20 are formed on the standard cells 60 in the same direction as the supplementary power-supply wires 30. Each cell power-supply wire 20 is located midway between two horizontal upper power-supply wires 50 and 50 so that the standard cells 60 and 60 arranged in two lines between those two horizontal upper power-supply wires 50 and 50 can share the cell power-supply wire 20. Each supplementary power-supply wire 30 is connected to a corresponding one of the cell power-supply wires 20 by two vias 25 and 25. The minimum number of vias 25 required for this connection is two, and thus three or more vias 25 may be used. As shown in FIG. 1, the wire width WA of the supplementary power-supply wires 30 is set larger than the wire width WS of the cell power-supply wires 20.

FIG. 2 illustrates the cross section of the power supply wiring structure of FIG. 1 taken along the line X-X'. As can be seen from FIG. 2, a number of semiconductor devices 70 such as transistors are formed (although only one device 70 is shown in the figure) on a semiconductor substrate 10. In FIG. 2, the semiconductor device 70 is connected to the cell power-supply wire 20 through two contacts 15. The cell power-supply wire 20 is connected to the supplementary power-supply wire 30 by the two vias 25, and then connected to the vertical upper power-supply wire 40 by the single via 35 and then to the horizontal upper power-supply wire 50 by the single via 45. It should be noted that the contacts 15 and the vias 25, 35, and 45 are formed in insulating layers, which are not shown in FIG. 2.

The distance between the two vias 25 and 25 that connect the cell power-supply wire 20 and the supplementary power-supply wire 30 is set to a given distance D. Within this given distance D, the vias 35 and 45 that establish the connections between the supplementary power-supply wire 30 and the upper power-supply wires 40 and 50 are located. In other words, the two vias 25 and 25 that are connected to the cell power-supply wire 20 are located at an equal distance (D/2) from the position of the upper vias 35 and 45, with one of the vias 25 and 25 situated in the right direction and the other in the left direction with respect to the position of the vias 35 and 45.

As can be seen from FIG. 2, power supply from the upper power-supply wires 50 and 40 to the cell power-supply wire 20 is performed as follows. Current from the horizontal upper power-supply wire 50 flows through the single via 45 into the vertical upper power-supply wire 40, and then passes through the single via 35 into the supplementary power-supply wire 30, where the current is divided into two when the current reaches the connection point of the supplementary power-supply wire 30 to the via 35, with one of the two currents going in the right direction and the other going in the left direction. The two currents then flow through the respective two vias 25 to the cell power-supply wire 20, from which the current passes through the contacts 15 and the semiconductor devices 70 formed within the standard cell 60, to a ground wire (not shown) passing through the standard cell 60.

In the power-supply wiring structure of this embodiment, the current that has flowed into the supplementary power-supply wire 30 is divided into two at the connection point to the via 35, and the two currents flow into the cell power-supply wire 20 through the two respective vias 25 and 25. Therefore, the current density at the connection point of the cell power-supply wire 20 to each via 25 is reduced by half as compared with a case in which a single via 25 is used. Since the current density at the connection point of the cell power-supply wire 20 to each via 25 is reduced, the current density is easily and reliably kept below a maximum allowable value. As a result, the reliability in terms of preventing EM-caused wire breaks is increased. In addition, since the thickness of the cell power-supply wire 20 is not increased, crosstalk between the cell power-supply wire and a neighboring signal wire and the like is suppressed effectively. Furthermore, the cell power-supply wire 20 has the typically employed wire width WS, such that the standard cell 60 area is not increased. The structure in which the vertical upper power-supply wire 40 and the supplementary power-supply wire 30 are connected by the single via 35 would conventionally cause the current density to be increased at the connection point of the supplementary power-supply wire 30 to the via 35. However, since the wire width WA of the supplementary power-supply wire 30 is larger than the wire width WS of the cell power-supply wire 20, the cross section of the supplementary power-supply wire 30 is increased to reduce the current density at the connection point to the via 35, thereby preventing the current density from exceeding the maximum allowable value. Even if the wire width WA of each supplementary power-supply wire 30 is increased, the standard cell 60 area is not affected, because the supplementary power-supply wires 30 are located above the standard cells 60.

When the two vias 25 are provided for the connection to the cell power-supply wire 20 as in this embodiment, it is preferable, in terms of the effective division of the current, that the via 35 be located in the middle position between the two vias 25 and 25 in the plane in which the supplementary power-supply wire 30 is formed. However, the via 35 does not necessarily have to be disposed in the middle position between the two vias 25, because in cases in which efficiency in forming the wiring structure is desired to be maintained at a given level, it may be difficult to dispose the via 35 in the middle position.

The two vias 25 are disposed so as to provide the divided current paths going from the supplementary power-supply wire 30 to the lower cell power-supply wire 20, and the distance between these two vias 25 and 25 is set at the given distance D. In order to reduce the current density at the connection point of the cell power-supply wire 20 to each via 25, it is preferable that the given distance D be determined in such a manner that a path (paths, desirably) that allows the current from the cell power-supply wire 20 to pass through the semiconductor devices 70 to the cell ground wire is present between the two vias 25.

(Modified Example of Cross-Sectional Structure)

Figure 3:
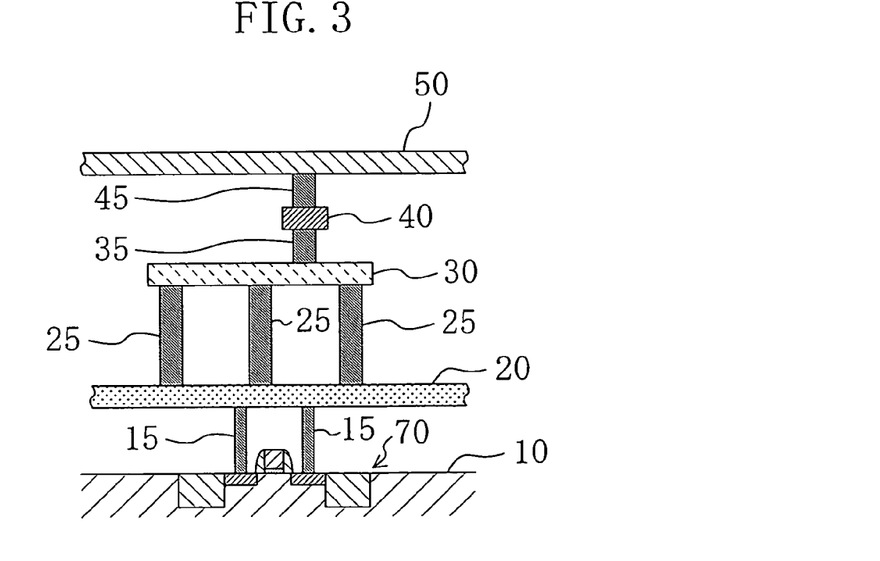
FIG. 3 illustrates a modified cross-sectional structure of the power supply wiring structure.

FIG. 3 illustrates a cross-sectional structure of power supply wiring, in which the number of vias 25 connected to the cell power-supply wire 20 is three. Since the three vias 25 are provided, the current density per unit cross-sectional area of the connection point of the cell power-supply wire 20 to each via 25 is reduced significantly as compared with the case in which two vias 25 are used. In addition, this reduction in the current density enables the wire width of the cell power-supply wire 20 to be decreased effectively.

(Modified Example of Planar Structure)

Figure 4:
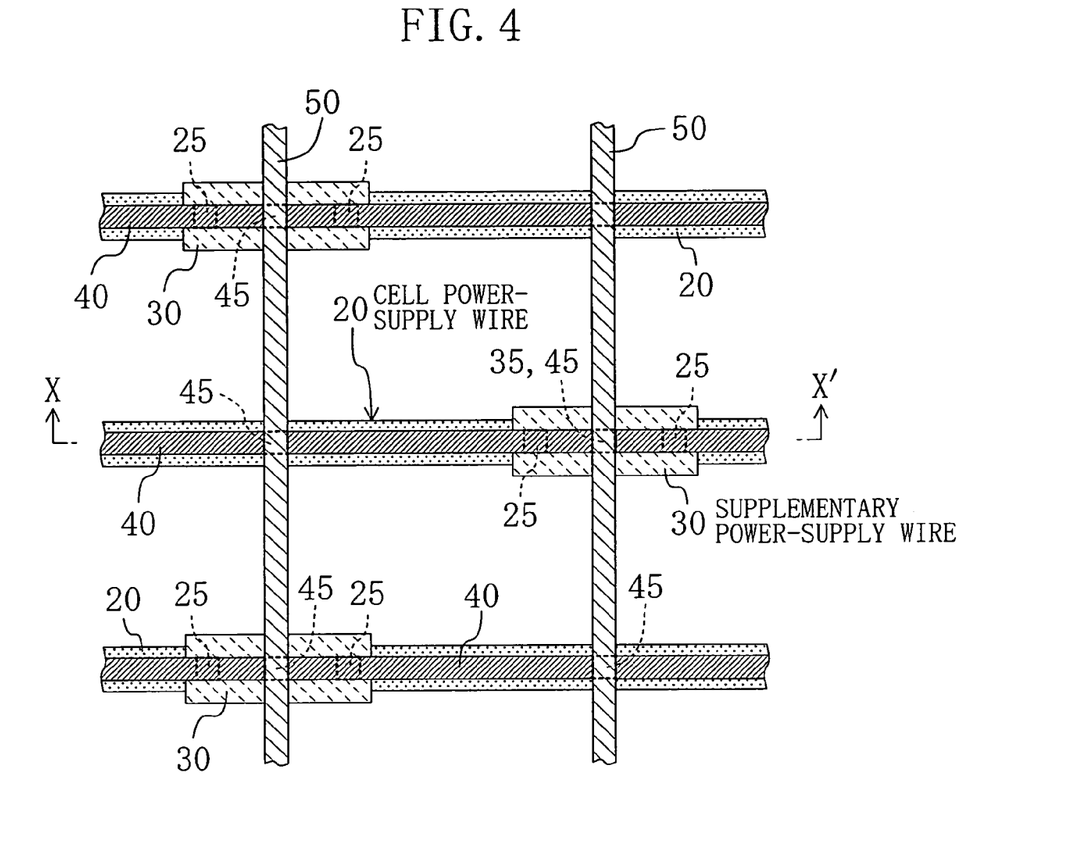
FIG. 4 illustrates a modified planar structure of the power supply wiring structure.

In the exemplary case described in the above embodiment, the vertical power-supply wires 40 are disposed above the supplementary power-supply wires 30, and the horizontal power-supply wires 50 are disposed above the vertical power-supply wires 40. As shown in FIG. 4, this modified example shows an exemplary case, in which horizontal power-supply wires 40 are disposed above supplementary power-supply wires 30, and vertical power-supply wires 50 are disposed above the horizontal power-supply wires 40.

Figure 5:
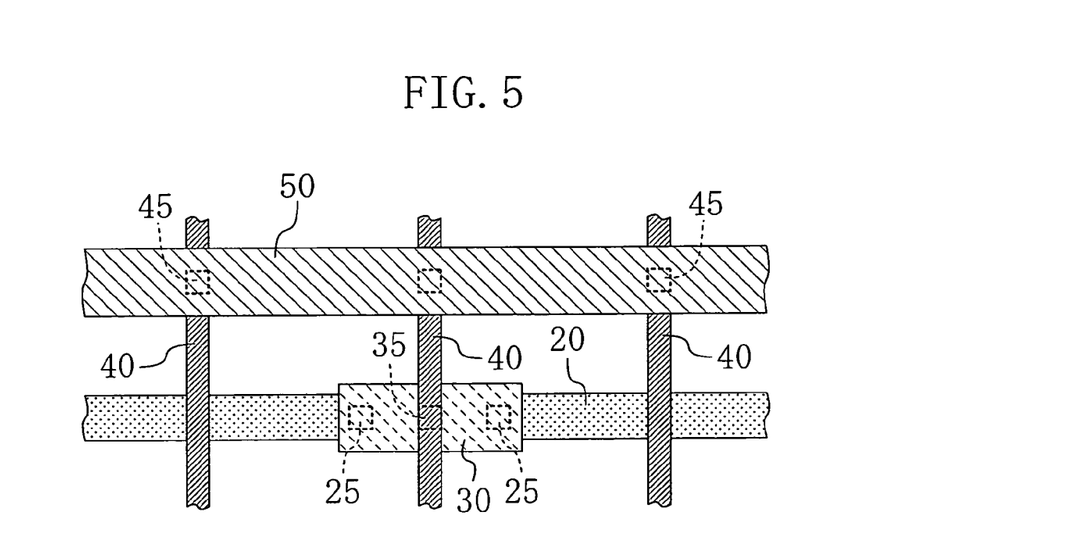
FIG. 5 illustrates another modified planar structure of the power supply wiring structure.

FIG. 5 indicates another modified example of the planar structure. As shown in FIG. 5, each horizontal upper power-supply wire 50 has a larger wire width than each horizontal upper power-supply wire 50 shown in FIG. 1.

SECOND EMBODIMENT

Figure 6:
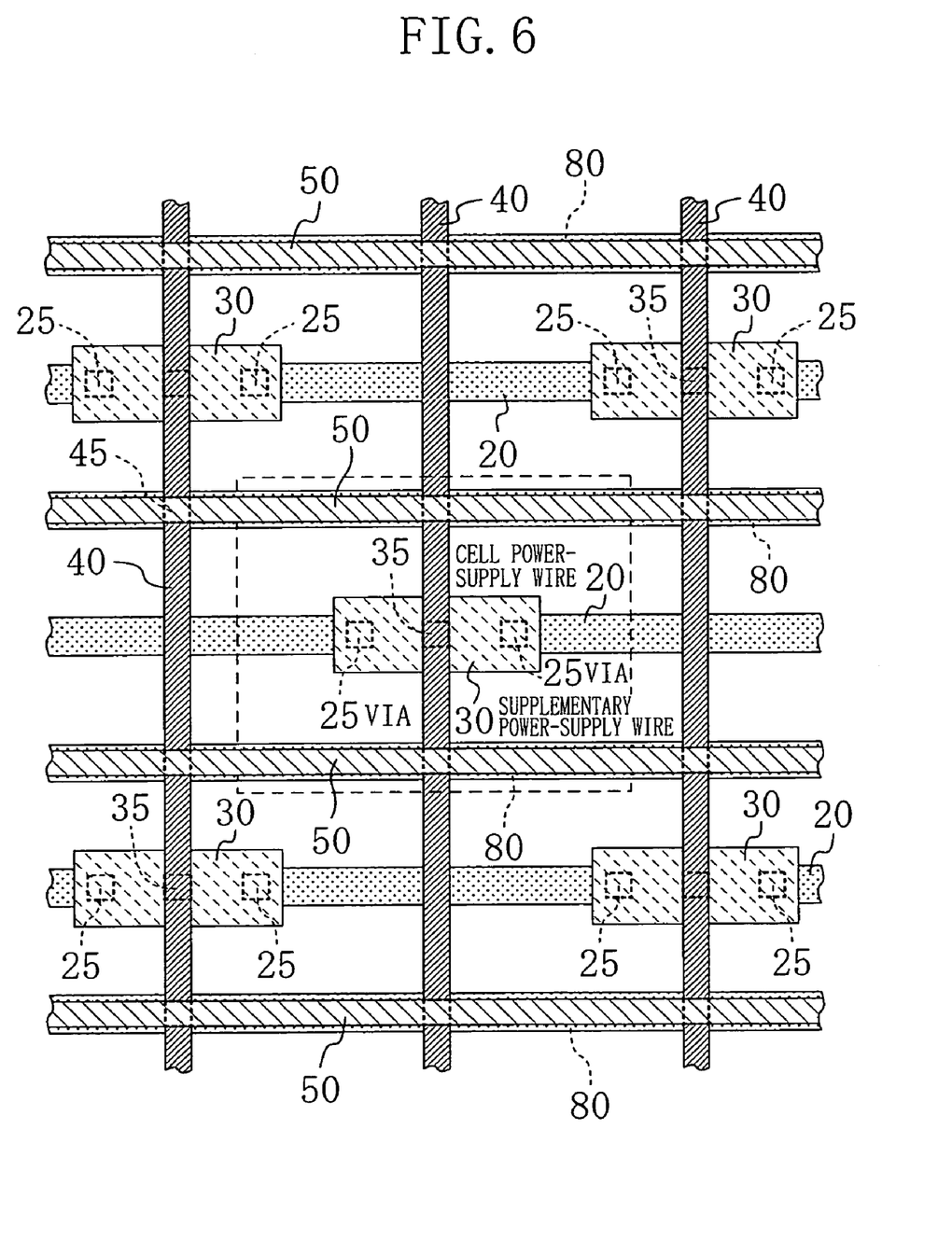
FIG. 6 is a plan view of a power-supply wiring structure in a semiconductor integrated circuit according to a second embodiment of the present invention.

FIG. 6 illustrates a power-supply wiring structure in a semiconductor integrated circuit according to a second embodiment of the present invention.

In FIG. 6, a number of horizontal upper power-supply wires 50 and a number of vertical power-supply wires 40, which are located below the horizontal upper power-supply wires 50, are provided and connected with each other at their intersection points by vias 45 so as to form a lattice-shaped power-supply wiring structure in a wide area. Supplementary power-supply wires 30 are connected to the vertical power-supply wires 40 by vias 35, wherein the number of vias 35 provided for the connection of each supplementary power-supply wire 30 is one.

Therefore, in this embodiment, when power is supplied from the upper power-supply wires 50 and 40, the amount of IR drop can be effectively restricted below a given value.

In FIG. 6, a plurality of cell ground wires 80 are disposed so that standard cells arranged in the same line (not shown in FIG. 6) can share one of the cell ground wires 80. The cell ground wires 80 are located below the respective horizontal upper power-supply wires 50 and extend in the same direction as the horizontal upper power-supply wires 50.

THIRD EMBODIMENT

Figure 7:
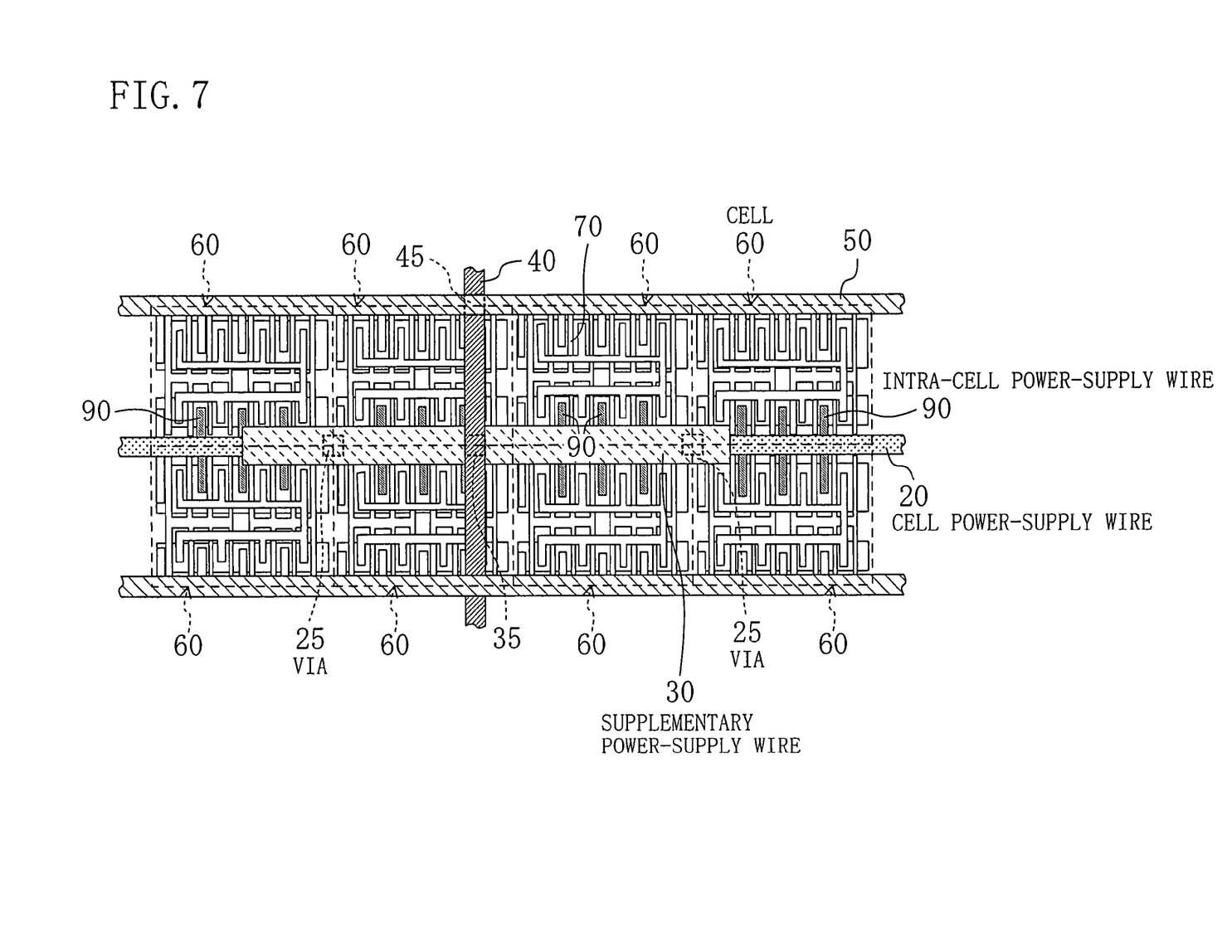
FIG. 7 is a plan view illustrating a main part of a power-supply wiring structure in a semiconductor integrated circuit according to a third embodiment of the present invention.

FIG. 7 illustrates a power-supply wiring structure in a semiconductor integrated circuit according to a third embodiment of the present invention.

The power-supply wiring structure shown in FIG. 7 is an enlarged detail view of a main part of the power-supply wiring structure of FIG. 6 surrounded by the dotted lines.

A main feature of the semiconductor integrated circuit of this embodiment is that a given distance D between two vias 25 and 25 provided for connection of a supplementary power-supply wire 30 and a cell power-supply wire 20 located below the supplementary power-supply wire 30 is determined by the number of standard cells disposed within the given distance D. As shown in FIG. 7, in this embodiment, two standard cells 60 are horizontally disposed between the two vias 25 and 25 that connect the supplementary power-supply wire 30 and the cell power-supply wire 20.

Specifically, within the cells 60, a number of semiconductor devices 70, which contribute to the circuit operation, are disposed. By the operation of these semiconductor devices 70, current passes from the cell power-supply wire 20 through these semiconductor devices 70 to, for example, the cell ground wire 80 disposed below the upper power-supply wire 50 shown in the lower portion of FIG. 7 (the cell ground wires 80 are shown in FIG. 6, but not shown in FIG. 7). In this structure, if the predetermined number (two) of standard cells 60 is disposed within the given distance D between the two vias 25 and 25, the current from each via 25 passes through the neighboring standard cell 60 to the ground wire 80, and does not reach the other via 25, such that the current density at the other via 25 is not increased. Therefore, the current density at the connection points of the cell power-supply wire 20 to the respective vias 25 and 25 is reliably reduced below a maximum allowable value.

Figure 8:
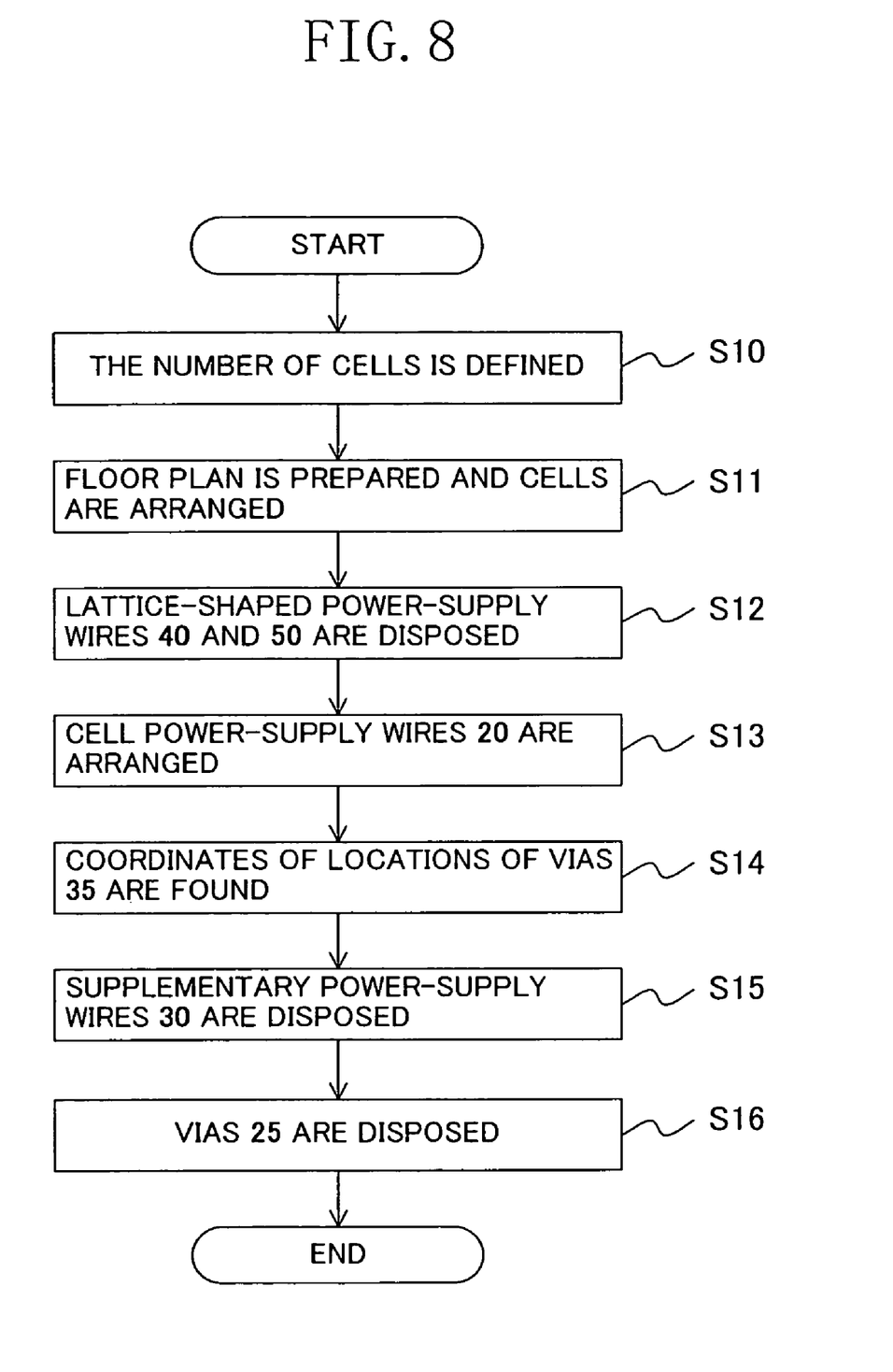
FIG. 8 is a flow chart in which the design of the power-supply wiring structure is shown.

A design flow for a case in which the above-described power-supply wiring structure is employed will be described with reference to FIG. 8. In a step S10 in FIG. 8, the number of standard cells to be disposed between each pair of vias 25 and 25 is determined.

In the next step S11, a floor plan is prepared and the cells are arranged. In a step S12, the lattice-shaped power-supply wires 50 and 40 are disposed. Then, in a step S13, the cell power-supply wires 20 are arranged on function blocks composed of the plurality of standard cells.

In a step S14, coordinates of points that can be the intersection points of the lower power-supply wires 40 of the lattice-shaped power-supply wires disposed in the step S12 and the cell power-supply wires 20 arranged in the step S13, when viewed from above, are found, and these coordinates of the intersection points are reserved as the coordinates of the respective locations of the vias 35. That is, these coordinates of the intersection points are reserved so as to allow the vias 35 to establish the connections between the lower power-supply wires 40 and the supplementary power-supply wires 30.

Then, in a step S15, each supplementary power-supply wire 30 is disposed in such a manner that the coordinates of an intersection point obtained in the step S14 is the center of the supplementary power-supply wire 30.

Next, in a step S16, in accordance with the number of standard cells set in the step S10, each cell power-supply wire 20 disposed in the step S13 and each supplementary power-supply wire 30 disposed in the step S15 are connected by at least two vias 25. In this step, the given distance D between the at least two vias 25 and 25 is set in such a manner that the number of standard cells determined in the step S10 is disposed between the vias 25 and 25. It is particularly desirable that the coordinates of the point located halfway between the at least two vias 25 and 25, which are calculated from the coordinates of the positions of the two vias 25 and 25, agree with the coordinates of the location of the corresponding via 35 obtained in the step S14.

The design flow described above facilitates the design of the power-supply wiring structure in the semiconductor integrated circuit of the first embodiment.

FOURTH EMBODIMENT

Next, a fourth embodiment of the present invention will be described with reference to FIG. 9.

In the third embodiment, the given distance D between the two vias 25 and 25 connected to the cell power-supply wire 20 is determined based on the number of standard cells to be located within the given distance D. In this embodiment, as shown in FIG. 7, a number of intra-cell power supply wires 90 are provided in standard cells 60 and connected to a cell power-supply wire 20, and the given distance D is determined so that at least a predefined number of intra-cell power supply wires 90 is located within the given distance D.

Figure 9:
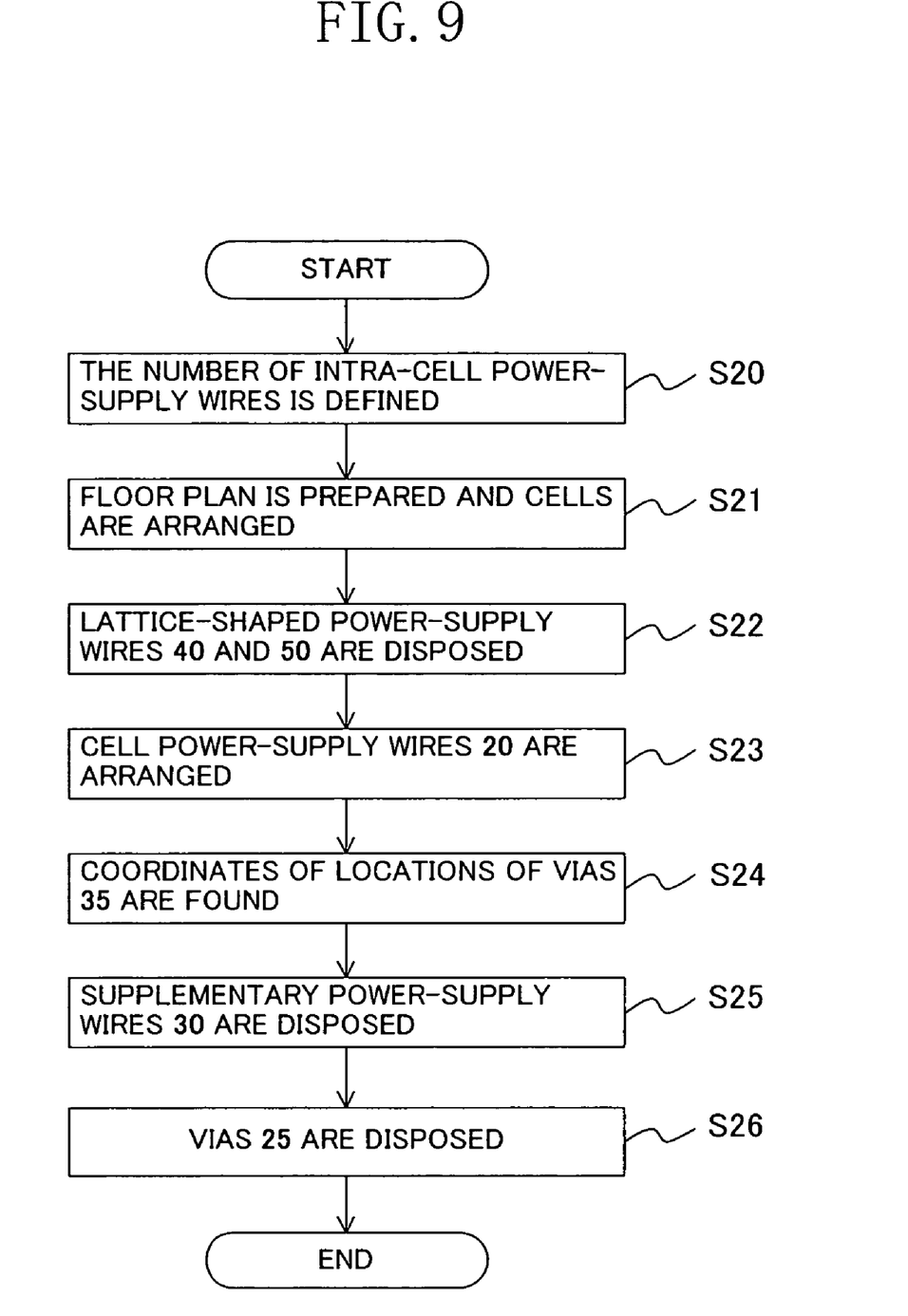
FIG. 9 is a flow chart showing the design of a power-supply wiring structure in a semiconductor integrated circuit according to a fourth embodiment of the present invention.

More specifically, in this embodiment, in a step S20 in the design flow shown in FIG. 9, the number of intra-cell power supply wires 90 to be located within the given distance D between the two vias 25 and 25 is set in advance. In a step S26, the given distance D between the two vias 25 and 25 to be provided for the connection of the cell power-supply wire 20 and the supplementary power-supply wire 30 is determined so that the number of intra-cell power supply wires 90 set in the step S20 is located within the given distance D, and the two vias 25 and 25 are disposed at the coordinates of the positions that correspond to the given distance D. Since the other steps S21 to S25 are the same as the steps S11 to S15 shown in FIG. 8, descriptions thereof will be omitted herein.

Therefore, in this embodiment, the design of the power-supply wiring structure in the semiconductor integrated circuit of the first embodiment is facilitated as in the third embodiment. In addition, in this embodiment, the given distance D is determined based on the number of intra-cell power supply wires 90 and thus can be determined more appropriately as compared with the third embodiment, which allows the wire length of the supplementary power-supply wires 30 to be shortened, thereby reducing adverse effects on the wiring efficiency.

FIFTH EMBODIMENT

Next, a fifth embodiment of the present invention will be described with reference to FIG. 10.

A main feature of this embodiment is that the given distance D between each pair of vias 25 and 25 connected to a cell power-supply wire 20 is determined by obtaining feedback on results of analysis of current density.

Hereinafter, a design flow for a power-supply wiring structure in a semiconductor integrated circuit according to this embodiment will be described with reference to FIG. 10. In a step S30 in FIG. 10, a floor plan is prepared and cells are arranged. In a step S31, lattice-shaped power-supply wires 50 and 40 are disposed. Next, in a step S32, cell power-supply wires 20 are disposed on function blocks composed of a plurality of standard cells.

Then, in a step S33, coordinates of points, at which the lower power-supply wires 40 of the lattice-shaped power-supply wires arranged in the step S31 and the cell power-supply wires 20 disposed in the step S32 can intersect each other, when viewed from above, are found, and these coordinates of the intersection points are reserved as the coordinates of the respective locations of the vias 35.

In a step S34, temporary wiring is carried out based on the results obtained in the steps S30 to S32. In a step S35, the current density in the cell power-supply wires 20 is analyzed based on the temporary wiring information obtained in the step S34, while it is determined whether or not the results of analysis of the current density in the cell power-supply wires 20 are within a specified value in each region of the semiconductor chip. When it is determined that the current density in the cell power-supply wires 20 is within the specified value in each region, the procedure goes to a step S36, which is a detail wiring step.

On the other hand, if there is a region in which the current density exceeds the specified value, the procedure goes to steps S37 to S39. In the step S37, of the coordinates of the locations of the vias 35 reserved in the step S33, the coordinates of a point that is closest to the region whose current density exceeds the specified value are selected, and a supplementary power-supply wire 30 is provided so as to be located at those selected coordinates. In the next step S38, the number of standard cells contained in the region the current density of which exceeds the specified value is counted. In the step S39, the supplementary power-supply wire 30 disposed in the step S37 is extended so that the number of standard cells obtained in the step S38 is contained within the extent of the supplementary power-supply wire 30, and the extended supplementary power-supply wire 30 is connected to a corresponding one of the cell power-supply wires 20 disposed in the step S32 by at least two vias 25. The coordinates of the positions of the two vias 25 and 25 are preferably determined in such a manner that the coordinates of the point located halfway between the two vias 25 and 25, which are calculated from the coordinates of the positions of the two vias 25 and 25, agree with the coordinates of the point selected from the set of coordinates obtained in the step S33, as being the closest to the region whose current density is beyond the specified value.

After the step S39, the procedure returns to the temporary wiring step S34, and the current density is analyzed again, and the steps S34 to S39 are repeated until the current density decreases below the specified value.

Therefore, in this embodiment, it is also possible to provide the supplementary power-supply wire 30 having the appropriately determined length in the region whose current density exceeds the specified value.

SIXTH EMBODIMENT

Figure 11:
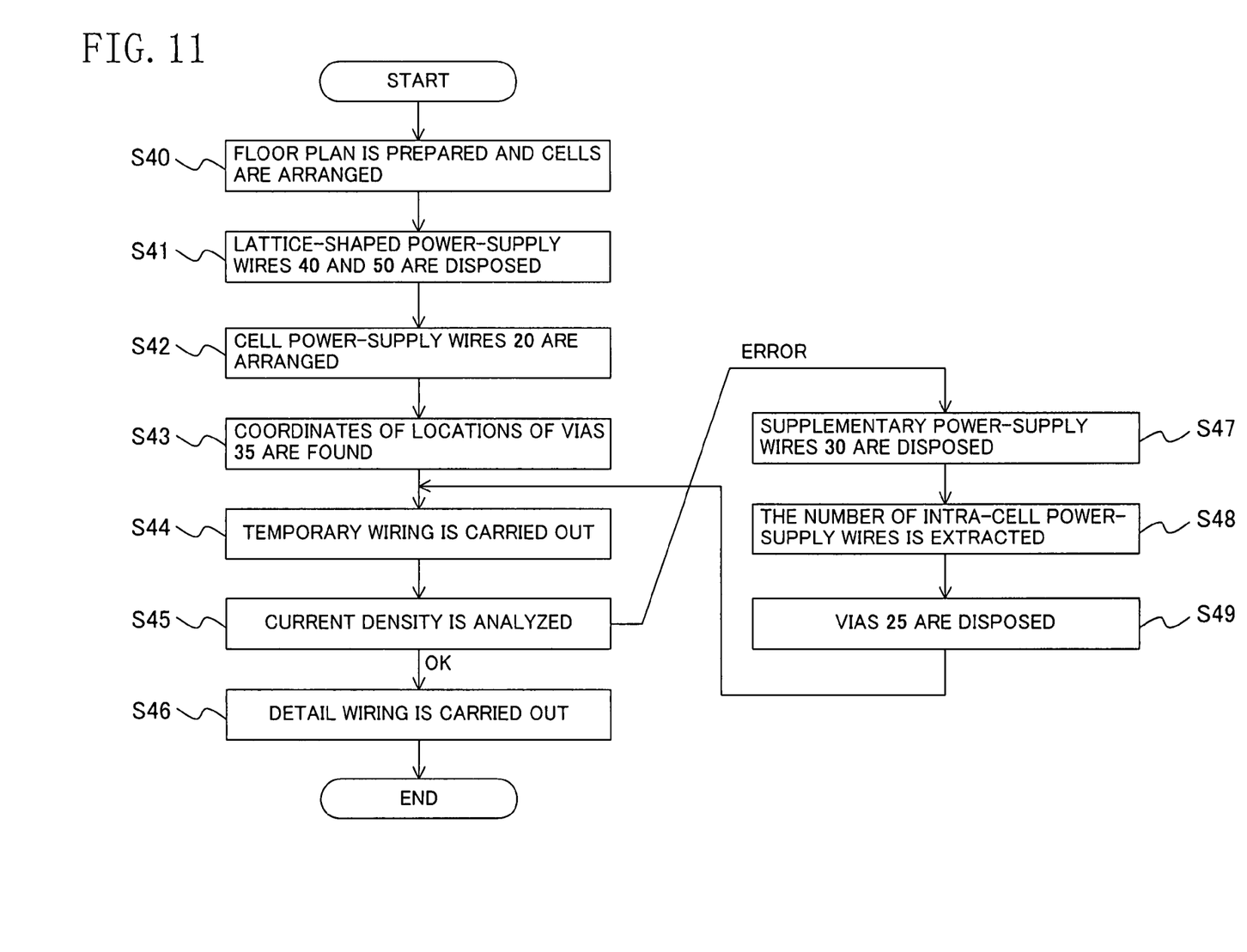
FIG. 11 is a flow chart showing the design of a power-supply wiring structure in a semiconductor integrated circuit according to a sixth embodiment of the present invention.

Next, a sixth embodiment of the present invention will be described with reference FIG. 11.

Figure 10:
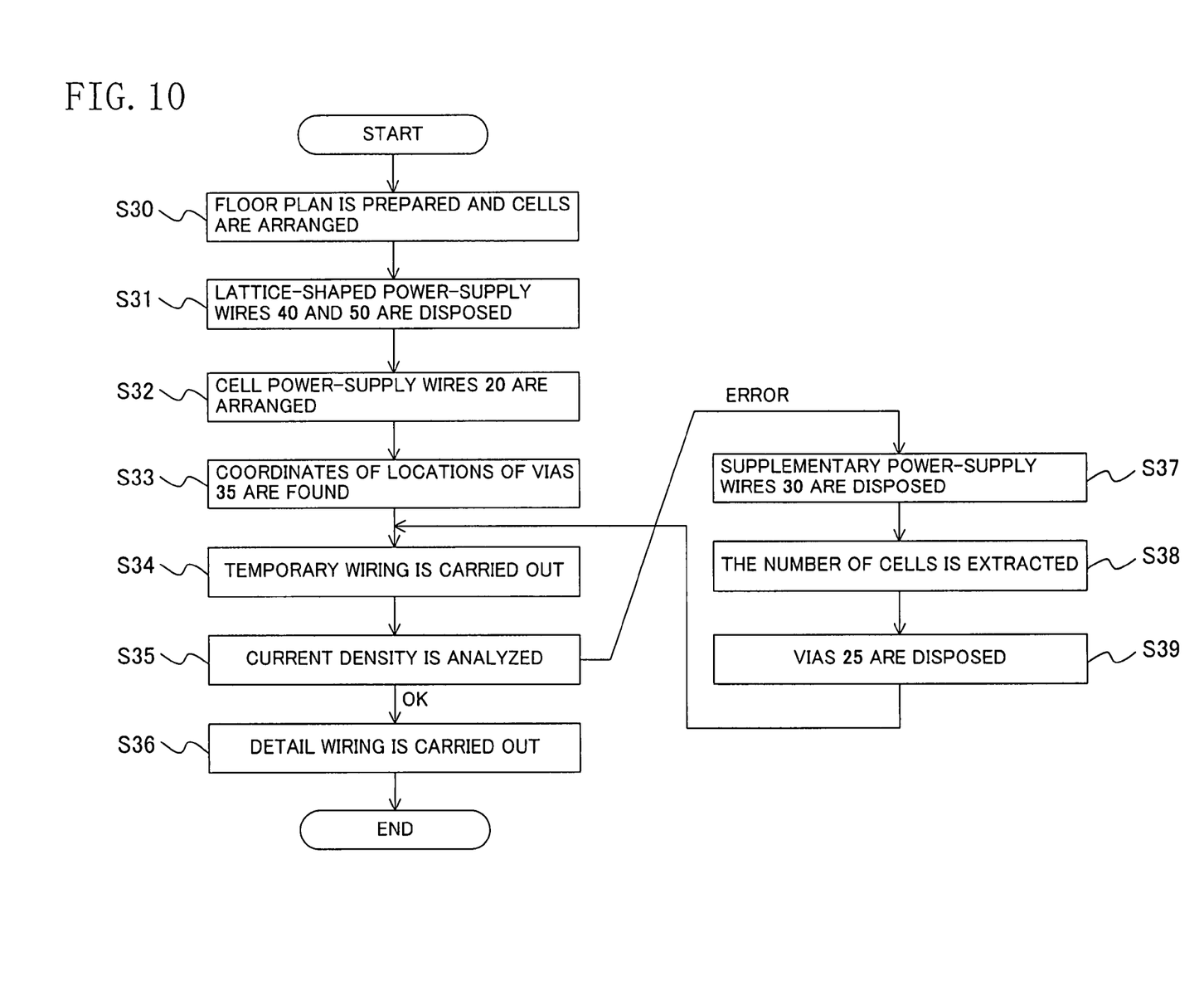
FIG. 10 is a flow chart showing the design of a power-supply wiring structure in a semiconductor integrated circuit according to a fifth embodiment of the present invention.

In the fifth embodiment, when there is a region in which the current density exceeds the specified value, the number of standard cells contained in that region is counted in the step S38 shown in FIG. 10. In this embodiment, however, when there is a region whose current density exceeds a specified value, the number of intra-cell power supply wires 90 contained in that region is counted in a step S48, as in the fourth embodiment.

In a step S49, a supplementary power-supply wire 30 provided is extended to such a degree that the number of intra-cell power supply wires 90 counted is contained within the extent of the supplementary power-supply wire 30, and the extended supplementary power-supply wire 30 is connected to a cell power-supply wire 20 by at least two vias 25. Since the other steps S40 to S47 are the same as the steps S30 to S37 shown in FIG. 10, descriptions thereof will be omitted herein.

Therefore, this embodiment produces, in addition to the effects obtainable in the fifth embodiment, the effects that the given distance D between the two vias 25 and 25 connected to the cell power-supply wire 20 is determined appropriately, which allows the wire length of the supplementary power-supply wire 30 to be shortened, thereby reducing an adverse effect on the wiring efficiency.

Although the supplementary power-supply wires 30 are provided for the cell power-supply wires 20 in the above-described structures, it is apparent that supplementary power-supply wires 30 may also be provided for the cell ground wires 80.

Also, the cells are standard cells in the above descriptions, but the present invention is applicable to structures in which gate array cells are used.

What is claimed is:

1. A semiconductor integrated circuit including a plurality of cells, the circuit comprising:
   a cell power-supply wire formed for the cells; and
   a supplementary power-supply wire disposed above the cell power-supply wire,
   wherein the cell power-supply wire and the supplementary power-supply wire are connected with each other by at least two vias;
   power is supplied from the supplementary power-supply wire to the cell power-supply wire through the at least two vias;
   an upper power-supply wire is disposed above the supplementary power-supply wire;
   the upper power-supply wire and the supplementary power-supply wire are connected with each other by a single via;
   power is supplied from the upper power-supply wire to the supplementary power-supply wire through the singe via; and
   the upper power-supply wire is a lattice-shaped power-supply wire arranged in a lattice.

2. The semiconductor integrated circuit of claim 1, wherein the supplementary power-supply wire has a larger wire width than the cell power-supply wire.

3. The semiconductor integrated circuit of claim 1, wherein the two vias that connect the cell power-supply wire and the supplementary power-supply wire are disposed in opposite directions with respect to the single via that connects the supplementary power-supply wire and the upper power-supply wire, the two vias being located at a given distance from the single via.

4. The semiconductor integrated circuit of claim 1, wherein at least a predefined number of cells is located between the two vias that connect the cell power-supply wire and the supplementary power-supply wire.

5. The semiconductor integrated circuit of claim 1, wherein at least a predefined number of intra-cell power-supply wires, which are disposed within the tells and connected to the cell power-supply wire, is located between the two vias that connect the cell power-supply wire and the supplementary power-supply wire.

6. The semiconductor integrated circuit of claim 1, wherein between the two vias that connect the cell power-supply wire and the supplementary power-supply wire, density of current flowing through the cell power-supply wire is equal to or less than a predetermined value.

* * * * *